(12) United States Patent
Yamaguchi et al.

(10) Patent No.: US 7,534,002 B2
(45) Date of Patent: May 19, 2009

(54) LIGHTING DEVICE

(75) Inventors: Seiji Yamaguchi, Aichi-ken (JP); Yoshinobu Suehiro, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 11/520,780

(22) Filed: Sep. 14, 2006

(65) Prior Publication Data
US 2007/0058357 A1 Mar. 15, 2007

(30) Foreign Application Priority Data
Sep. 15, 2005 (JP) ............... 2005-268851

(51) Int. Cl.
*F21V 9/16* (2006.01)
(52) U.S. Cl. ............ 362/84; 362/256; 362/294; 362/800
(58) Field of Classification Search ........ 362/84, 362/231, 237, 240, 243, 244, 246, 247, 249, 362/252, 255, 256, 267, 294, 800; 257/98, 257/99, 100
See application file for complete search history.

(56) References Cited

U.S. PATENT DOCUMENTS

| | | | | |
|---|---|---|---|---|
| 6,155,699 A | * | 12/2000 | Miller et al. | 362/293 |
| 6,345,903 B1 | * | 2/2002 | Koike et al. | 362/249 |
| 6,578,998 B2 | * | 6/2003 | Zhang | 362/294 |
| 6,850,002 B2 | * | 2/2005 | Danielson et al. | 362/84 |
| 6,864,513 B2 | * | 3/2005 | Lin et al. | 257/99 |
| 7,108,386 B2 | * | 9/2006 | Jacobson et al. | 362/800 |
| 7,226,189 B2 | * | 6/2007 | Lee et al. | 362/800 |
| 7,382,033 B2 | * | 6/2008 | Roth et al. | 257/98 |
| 2003/0021117 A1 | * | 1/2003 | Chan | 362/84 |
| 2006/0012991 A1 | * | 1/2006 | Weaver et al. | 362/231 |
| 2007/0103939 A1 | * | 5/2007 | Huang et al. | 362/633 |

FOREIGN PATENT DOCUMENTS

| | | | |
|---|---|---|---|
| JP | 10-2542513 | | 9/1998 |
| JP | 2000299503 A | * | 10/2000 |
| JP | 2004-505172 | | 2/2004 |
| WO | WO 02/11173 A1 | | 2/2002 |
| WO | WO 2004/082036 A1 | | 9/2004 |

* cited by examiner

*Primary Examiner*—Y My Quach Lee
(74) *Attorney, Agent, or Firm*—McGinn IP Law Group, PLLC

(57) ABSTRACT

A lighting device having: a light-emitting diode lamp having a light-emitting diode device sealed by a glass sealing part; and a fluorescent layer disposed on the side of an illuminated object of the light-emitting diode lamp. The fluorescent layer is operable to radiate a wavelength-converted light by being excited by light emitted from the light-emitting diode device.

16 Claims, 14 Drawing Sheets

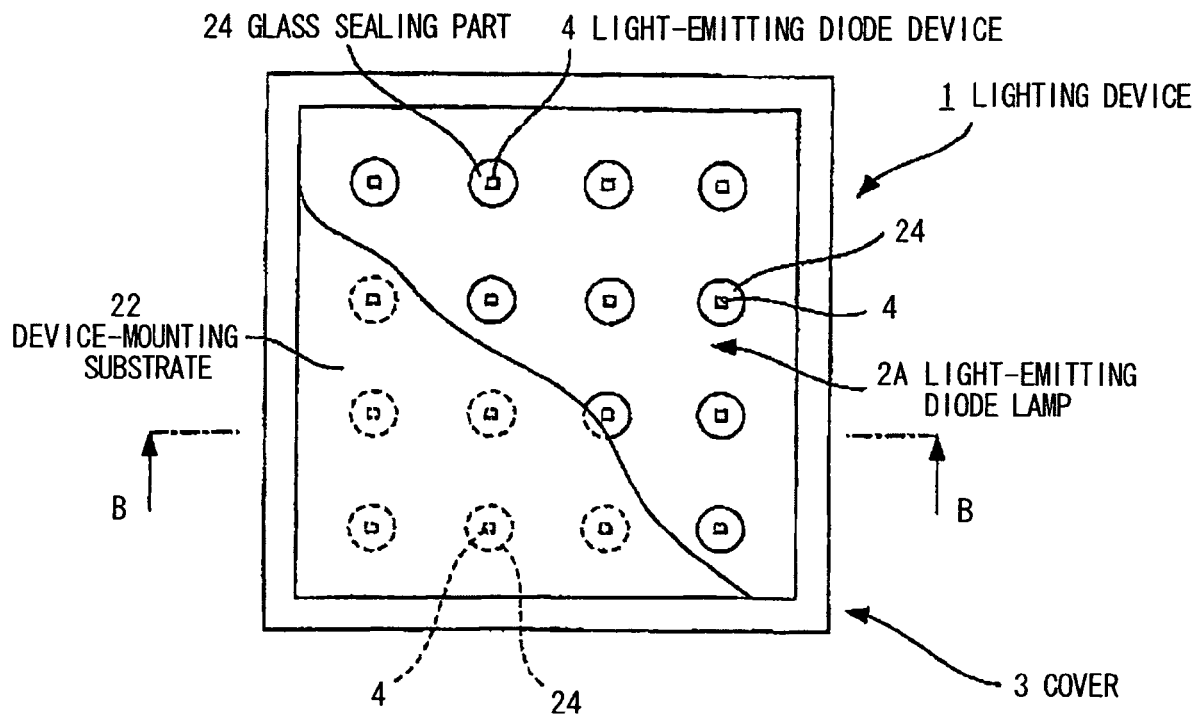
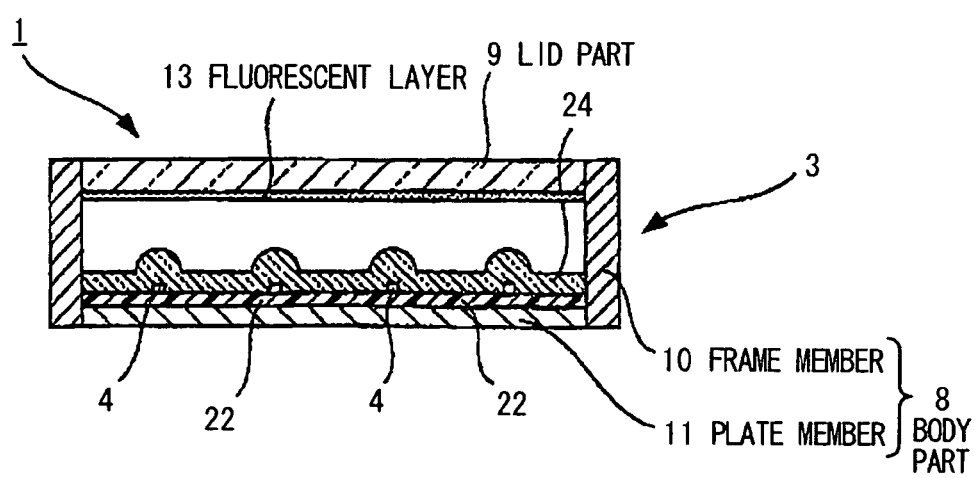

- 4 LIGHT-EMITTING DIODE DEVICE
- 5 DEVICE-AMOUNTING SUBSTRATE
- 3 COVER
- 6 GLASS SEALING PART
- 13 FLUORESCENT LAYER

- 50 LIGHT REFLECTING SURFACE

LIGHTING DEVICE

The present application is based on Japanese patent application No. 2005-268851, the entire contents of which are incorporated herein by reference.

BACKGROUND OF THE INVENTION

1. Field of the Invention

The present invention relates to a lighting device that is suitable for use in various light sources, e.g., a backlight light source for a liquid-crystal television.

2. Description of the Related Art

Recently, a lighting device comprising a light emitting diode (=LED) device has been adopted instead of a cold-cathode fluorescent tube containing a mercury gas therein, from the viewpoints of eliminating the harmful mercury gas on the environment (or human body), preventing component parts from deteriorating by ultraviolet radiation, decreasing the electric power consumption cost due to the use of an inverter circuit, and obtaining a good color reproducibility.

Generally, in this kind of lighting device, to obtain white light, red, green and blue light-emitting diode devices, or blue-green and yellow light-emitting diode devices are used.

However, since this kind of lighting device uses semiconductor light-emitting diode devices comprising different semiconductor materials respectively, the LED devices each require a different driving electric power so that its electric current needs to be adjusted by ensuring an electric power source for each of the devices. Further, since the light-emitting diode devices each are a semiconductor light-emitting diode device, temperature characteristics and deterioration with time of the devices are different respectively so that color tones thereof may change separately. Further, unless lights emitted from the light-emitting diode devices are evenly mixed, unevenness of color may occur.

In order to avoid the disadvantages described above, a lighting device is disclosed which can obtain white light by using a single light-emitting diode device.

This kind of a known lighting device comprises a housing with an opening facing an illuminated object and electrodes, a light-emitting diode device disposed in the housing, and a mold member containing a phosphor for sealing the light-emitting diode device (e.g., JP-A-10-242513).

JP-A-10-242513 also discloses a lighting device which comprises two leads a part of which is exposed to the outside, a light-emitting diode device mounted on one lead (=mount lead) of the two leads, a first mold member containing the phosphor for sealing the light-emitting diode device, and a second mold member with an optical shape surface for sealing the light-emitting diode device and the lead (a part thereof).

Further, another conventional lighting device is proposed which comprises two leads a part of which is exposed to the outside, a light-emitting diode device mounted on one lead (=mount lead) of the two leads, a mold member with an optical shape surface for sealing the light-emitting diode device, and a phosphor member laminated on the optical shape surface of the mold member.

In the three lighting devices described above, the light-emitting diode device to emit blue light, and the phosphor to emit yellow light by being excited by the blue light are used such that that white light is radiated, toward the illuminated object, as a mixture of the blue light emitted from the light-emitting diode device and the yellow light emitted from the phosphor.

However, the lighting devices shown in JP-A-10-242513, i.e., the two lighting devices comprising the mold member containing the phosphor and the other lighting device comprising the phosphor member laminated on the optical shape surface of the mold member, have the disadvantage that the phosphor and the mold member deteriorate by heat generated from the light-emitting diode device during the operation so that the former (i.e., the lighting devices shown in JP-A-10-242513) will be subjected to a reduction in excitation efficiency of the phosphor, and the latter (i.e., the other lighting device described above) will be subjected to a reduction in transparency of the mold member. Thus, none of the lighting devices can obtain a high-brightness illuminating light over the long term.

SUMMARY OF THE INVENTION

Accordingly, it is an object of the invention to provide a lighting device that can prevent a phosphor (or a fluorescent layer) from decreasing in excitation efficiency and can prevent a sealing member (or a sealing part) from decreasing in transparency, and further can supply a high-brightness illuminating light over the long term.

According to the invention, a lighting device comprises:

a light-emitting diode lamp comprising a light-emitting diode device sealed by a glass sealing part; and a fluorescent layer disposed on a side of an illuminated object of the light-emitting diode lamp, the fluorescent layer being operable to radiate a wavelength-converted light by being excited by light emitted from the light-emitting diode device.

<Advantages of the Invention>

The invention can provide a lighting device that can prevent a fluorescent layer from decreasing in excitation efficiency and can prevent a sealing part from decreasing in transparency, and further can provide a high-brightness illuminating light over the long term.

BRIEF DESCRIPTION OF THE DRAWINGS

The preferred embodiments according to the invention will be explained below referring to the drawings, wherein:

FIG. 3A is a partially removed front view schematically showing a lighting device in a second preferred embodiment according to the invention;

FIG. 3B is a cross sectional view taken along the line B-B in FIG. 3A;

DETAILED DESCRIPTION OF THE PREFERRED EMBODIMENTS

Next, preferred embodiments according to the present invention will be explained in conjunction with the accompanying drawings.

First Embodiment

Whole Composition of Lighting Device

Figure 1A:
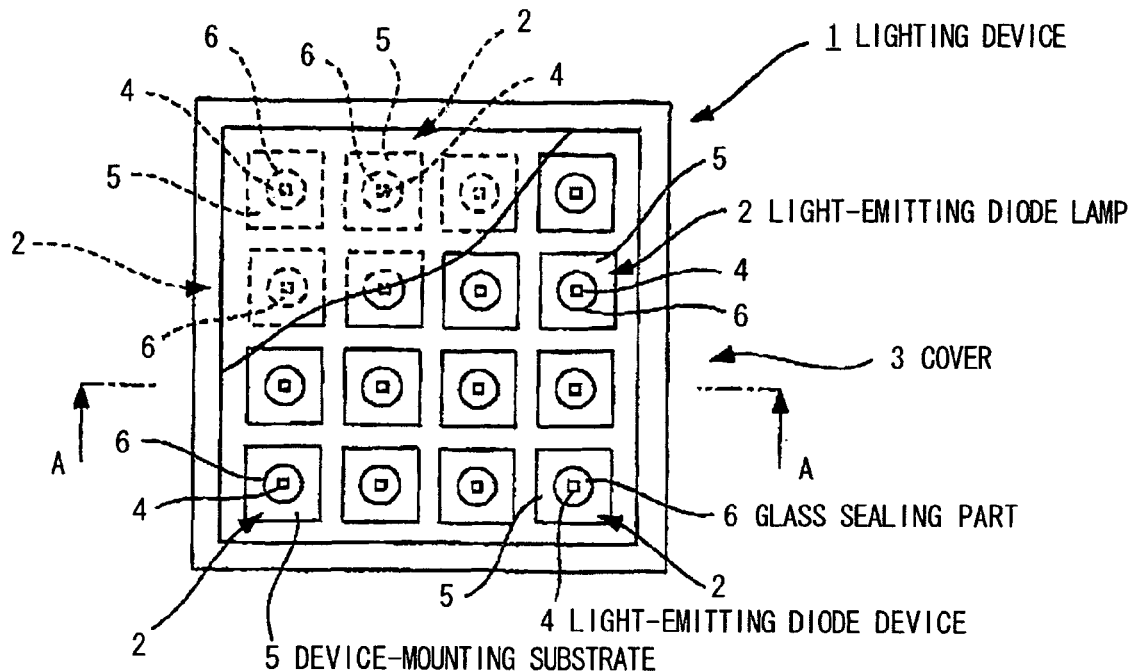
FIG. 1A is a partially removed front view schematically showing a lighting device in a first preferred embodiment according to the invention.
Figure 1B:
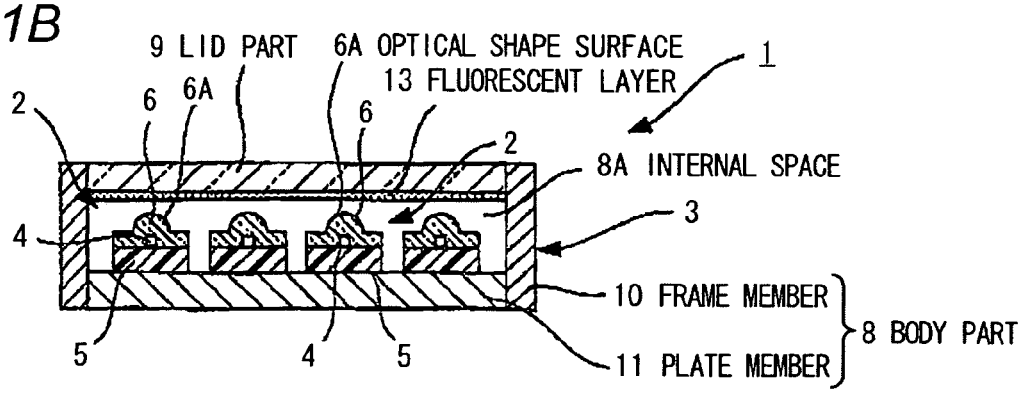
FIG. 1B is a cross sectional view taken along the line A-A in FIG. 1A.
Figure 1C:
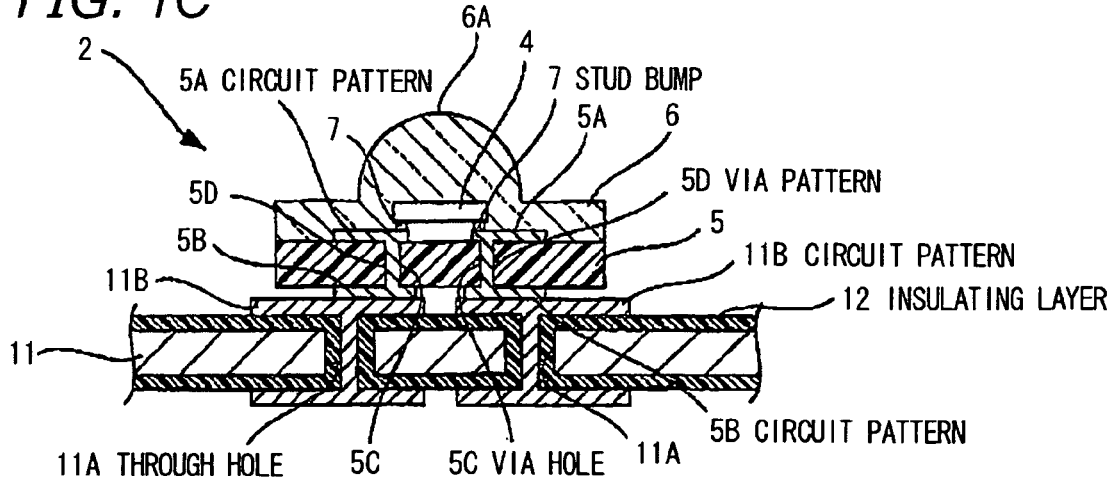
FIG. 1C is a partially enlarged cross sectional view showing a part of FIG. 1B.

As shown in FIGS. 1A to 1C, a lighting device 1 approximately comprises plural light-emitting diode lamps 2 for radiating white light to the side of an illuminated object, and a cover 3 with a fluorescent layer 13 to house the light-emitting diode lamps therein.

Composition of Light-Emitting Diode Lamp

As shown in FIG. 1A, the light-emitting diode lamps 2 are disposed in lengthwise and crosswise directions on the same plane (in this embodiment four lamps in the lengthwise direction and four lamps in the crosswise direction are disposed). Hereinafter, only a single light-emitting diode lamp 2 will be explained, since every light-emitting diode lamp 2 has almost the same structure. As shown in FIGS. 1B and 1C, the light-emitting diode lamp 2 comprises a light-emitting diode device 4 to emit blue light and a device-mounting substrate 5 mounting the light-emitting diode device 4 thereon, and the light-emitting diode lamp 2 is housed in a cover 3.

As shown in FIG. 1B, the cover 3 comprises a body part 8 having an internal space 8A opening to the side of the illuminated object, and a lid part 9 covering the opening of the internal space 8A, so that the cover 3 houses the light-emitting diode lamp 2 with a glass sealing part 6 therein.

The glass sealing part 6 has an optical shape surface 6A on the side of the illuminated object and the whole of the glass sealing part 6 is composed of a low-melting glass of $SiO_2$—$Nb_2O_5$ system (refractive index n=1.8). A thermal expansion coefficient a of the glass sealing part 6 is set to be $\alpha=7\times10^{-6}/°$ C.

The device-mounting substrate 5 is composed of a nearly planar and square-shaped (lengthwise size: 1 mm, crosswise size: 1 mm) ceramic substrate (e.g., an $Al_2O_3$ substrate) having circuit patterns 5A, 5B on the front and back surfaces, respectively. A thermal expansion coefficient a of the device-mounting substrate 5 is set to be $\alpha=7\times10^{-6}/°$ C. As shown in FIG. 1C, the device-mounting substrate 5 has via holes 5C opening on both sides of the circuit patterns 5A, 5B (on front and back surfaces). In the via holes 5C, via patterns 5D made of tungsten (W) and connecting to the circuit patterns 5A, 5B are formed.

The body part 8 comprises a frame member 10 opening to both the side of the illuminated object and the opposite side to the illuminated object, and a plate member 11 covering the opening of the frame member 10 on the opposite side to the illuminated object, so that the body part 8 comprises a box with a bottom opening to the side of the illuminated object as a whole.

The frame member 10 is formed with a square-framed heat radiating member and the plate member 11 is formed with a square plate-shaped heat radiating member. The frame member 10 and the plate member 11 are made of a metal such as copper and aluminum. Especially, the frame member 10 is made of a material that is hard to deteriorate due to light emitted from the glass-sealed LED (i.e., the light-emitting diode device 4). For example, the frame member 10 can be acrylic resin, glass, ceramic, metal etc. which maybe transparent or not transparent. As shown in FIG. 1C, the plate member 11 has through holes 11A opening to front-back both surfaces thereof and has such a structure that the light-emitting diode lamp 2 can be mounted on the front surface thereof. On the plate member 11, an insulating layer 12 is formed and the insulating layer 12 is composed of e.g. an oxide film such as $SiO_2$ and the like, or a plastic film of polyimide series covering the front-back both surfaces of the plate member 11 and inner surfaces of the through holes 11A. On the insulating layer 12, circuit patterns 11B made of tungsten (W) and connecting to circuit patterns 5B of the device-mounting substrate 5 are formed.

The lid part 9 is disposed on the end face of the opening of the body part 8 and is formed with a square plate-shaped transparent member made of a glass as a whole. On the side of the light-emitting diode lamp 2 of the lid part 9, a fluorescent layer 13 is formed which is made of yttrium aluminum garnet (YAG) etc. to radiate yellow wavelength-converted light by being excited by light (i.e., blue light) emitted from the light-emitting diode device 4. The lid part 9 is made of a material that is hard to deteriorate due to light emitted from the glass-sealed LED (i.e., the light-emitting diode device 4). For example, the lid part 9 can be a resin material such as polymethylmethacrylate (PMMA) and acrylic resin, glass, ceramic etc. which are transparent.

Figure 2:
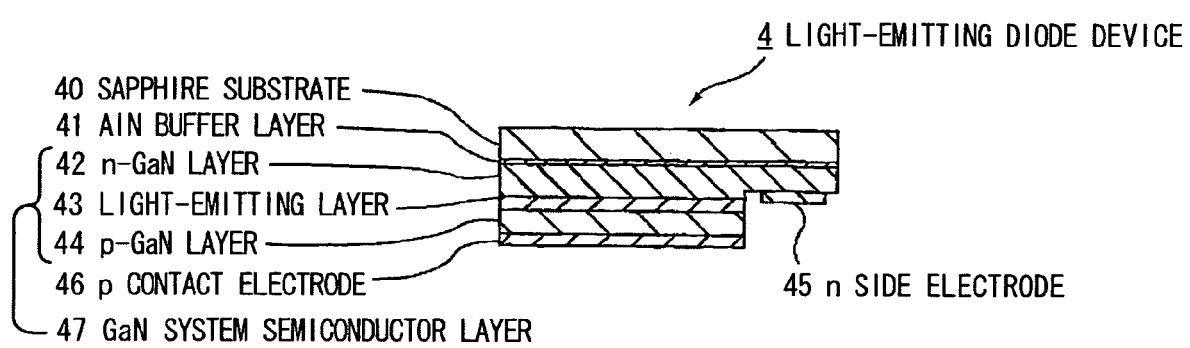
FIG. 2 is a longitudinal cross sectional view showing a light-emitting diode device in the first preferred embodiment according to the present invention.

As shown in FIG. 2, the light-emitting diode device (or a flip-chip type light-emitting diode device) 4 is formed by growing, on a sapphire substrate 40, a GaN system semiconductor layer 47 by an MOCVD (metalorganic chemical vapor deposition) apparatus.

The GaN system semiconductor layer 47 is formed such that an AlN buffer layer 41 is formed on the sapphire substrate 40, and a Si doped n-GaN layer 42, light-emitting layer 43, and Mg doped p-GaN layer 44 are then grown thereon sequentially. A p-contact electrode 46 made of ITO (indium tin oxide) is formed on the p-GaN layer 44. Further, an n-side electrode 45 is formed on the surface of a part of the n-GaN layer 42 exposed by etching the p-GaN layer 44 to the n-GaN layer 42.

The light-emitting diode device 4 is formed with a standard size (lengthwise size: 0.3 mm, crosswise size; 0.3 mm). A thermal expansion coefficient of the ITO constituting the p-contact electrode 46 as a conductive oxide film is $7 \times 10^{-6}/°C$., which is equal to that of the light-emitting diode device 4, so that the ITO is hard to cause electrode separation due to difference in thermal expansion coefficient therebetween. Further, the light-emitting diode device 4 is sealed by the glass sealing part 6 and is electrically connected to a device-mounting part of a circuit pattern 5A (as described later) of the device-mounting substrate 5 through stud bumps 7.

Operation of Lighting Device

When a power voltage is applied to the light-emitting diode lamp 2 from a power supply, a light-emitting layer 43 of the light-emitting diode device 4 emits light, so that the emitted light is irradiated to the internal space 8A of the body part 8. Then, the light emitted from the light-emitting diode device 4 enters the fluorescent layer 13. In this case, the fluorescent layer 13 radiates yellow wavelength-converted light by being excited by the light (i.e. , blue light) emitted from the light-emitting diode device 4. Therefore, the blue light emitted from the light-emitting diode device 4 is mixed with the yellow wavelength-converted light radiated from the fluorescent layer 13, so that white light is obtained. After that, the white light is discharged from the fluorescent layer 13 toward the lid part 9, and passes through the lid part 9 so as to illuminate the illuminated object.

Advantages of the First Embodiment

The following advantages are obtained by the first preferred embodiment as explained above.

(1) The light-emitting diode device 4 is sealed by the glass sealing part 6 and also the fluorescent layer 13 is dispose on the end face of the lid part 9 on the side of the light-emitting diode lamp 2 where heat is not transmitted directly from the light-emitting diode device 4, so that the glass sealing part 6 and the fluorescent layer 13 do not deteriorate by heat generated from the light-emitting diode device 4. Therefore, a decrease in transparency of the glass sealing part 6 and excitation efficiency of the frame member 13 can be prevented, and a high-brightness illuminating light can be obtained over the long term.

(2) The light-emitting diode lamp 2 is disposed in the body part 8 made of a metal, so that the heat generated from the light-emitting diode device 4 can be radiated to the outside of the body part 8 through the body part 8 (the frame member 10 and the plate member 11). Therefore, the radiation effect can be enhanced. Also, the light-emitting diode device 4 is composed as a glass sealed LED, so that in a heat resistance the device 4 can be superior to a plastic sealed LED. Therefore, it can be easily achieved to respond to a large-current requirement.

(3) The plural light-emitting diode lamps 2 are disposed in lengthwise and crosswise directions on the same plane, so that, if a part of the light-emitting diode lamps 2 breaks down, it is only necessary to exchange the broken lamp on repair and check time. Therefore, the exchanging cost of the lamps can be reduced.

(4) The fluorescent layer 13 is formed in a film shape on the lid part 9, so that a fluorescent substance usage can be reduced comparing with a method of mixing the fluorescent substance to a plastic resin. Therefore, the material cost can be reduced. And also, the fluorescent layer 13 is formed in a film shape, so that a dispersion of chromaticity due to precipitation of the fluorescent substance can be suppressed. And further, a control of the film thickness is easily conducted, so that a fluorescent member having a less unevenness of the fluorescent substance and a high quality can be easily obtained.

Second Embodiment

In FIG. 3, like components are indicated by using the same numerals as in FIGS. 1A and 1B and the detailed explanation is omitted.

As shown in FIGS. 3A and 3B, a lighting device 1 of the second preferred embodiment has the features that the lighting device 1 comprises a light-emitting diode lamp 2A having plural light-emitting diode devices 4 disposed in lengthwise and crosswise directions on the same plane and having a single device-mounting substrate 22 for mounting the plural light-emitting diode devices 4.

The light-emitting diode devices 4 are sealed by a glass sealing part 24 made of the same material as the glass sealing part 6 in the first preferred embodiment and are arrayed through the glass sealing part 24.

Advantages of the Second Embodiment

The advantages obtained by the second preferred embodiment in addition to the advantages (1) and (2) of the first preferred embodiment are as follows.

The light-emitting diode devices 4 are disposed on the single device-mounting substrate 22 and are arrayed through the glass sealing part 24, so that the light-emitting diode lamp 2A can be easily manufactured. Therefore, the manufacturing cost can be also reduced.

Third Embodiment

Figure 4A:
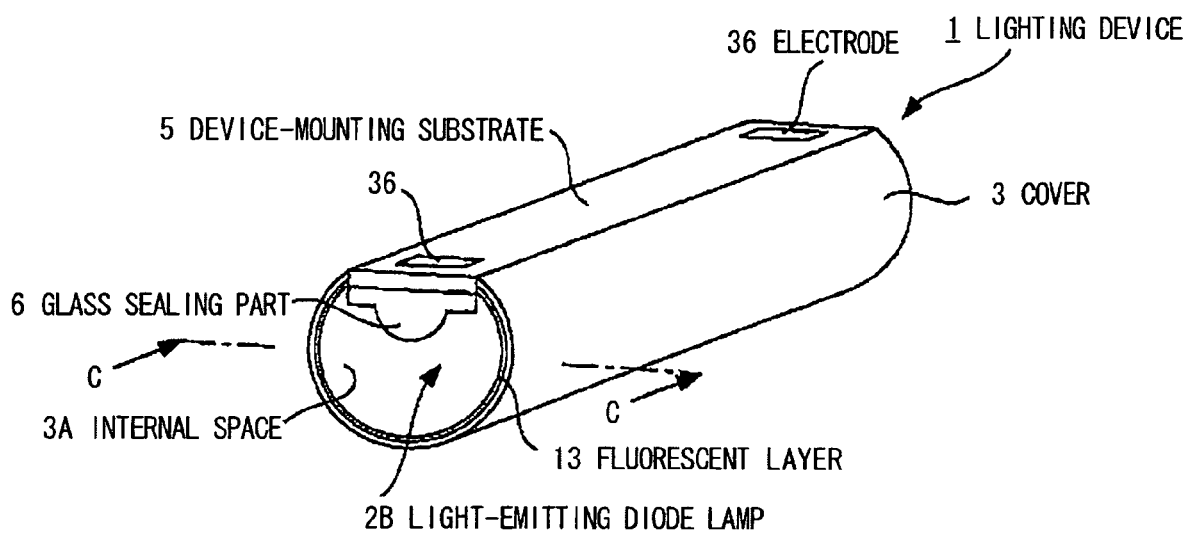
FIG. 4A is a perspective view schematically showing a lighting device in a third preferred embodiment according to the invention.
Figure 4B:
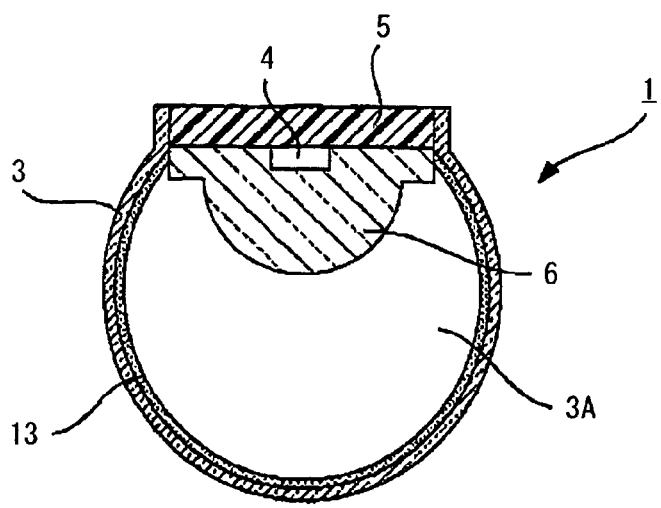
FIG. 4B is a cross sectional view (an enlarged view) taken along the line C-C in FIG. 4A.

In FIG. 4A and 4B, like components are indicated by using the same numerals as in FIG. 1B is and the detailed explanation is omitted.

As shown in FIGS. 4A and 4B, a lighting device 1 of the third preferred embodiment has the features that the lighting device 1 comprises a light-emitting diode lamp 2B having plural light-emitting diode devices 4 (only one device 4 is shown in FIG. 4A) disposed in one direction on the same plane and having a single device-mounting substrate 5 (a ceramic substrate) for mounting the plural light-emitting diode devices 4, and a cover 3 to house the light-emitting diode lamp therein.

The cover 3 has an internal space 3A to house the light-emitting diode lamp 2B therein, and the cover 3 is composed of a curved surface member which has a curvature on the side of the light-emitting diode lamp 2B and has a shape like a fluorescent tube, and the curved surface member is composed of a translucent member. On the surface of the cover 3 on the side of the light-emitting diode lamp 2B a fluorescent layer 13 made of the same material as the fluorescent layer 13 in the first preferred embodiment is formed. Further, in FIG. 4A, 36 indicates an electrode for supplying a power supply voltage.

Advantages of the Third Embodiment

The advantages obtained by the third preferred embodiment in addition to the advantage (1) of the first preferred embodiment are as follows.

The cover 3 is composed of the curved surface member having the fluorescent tube shape, so that the lighting device 1 of the third preferred embodiment can be used without any changes, for example, as a backlight source for a television, in stead of a built-in fluorescent tube.

Figure 5A:
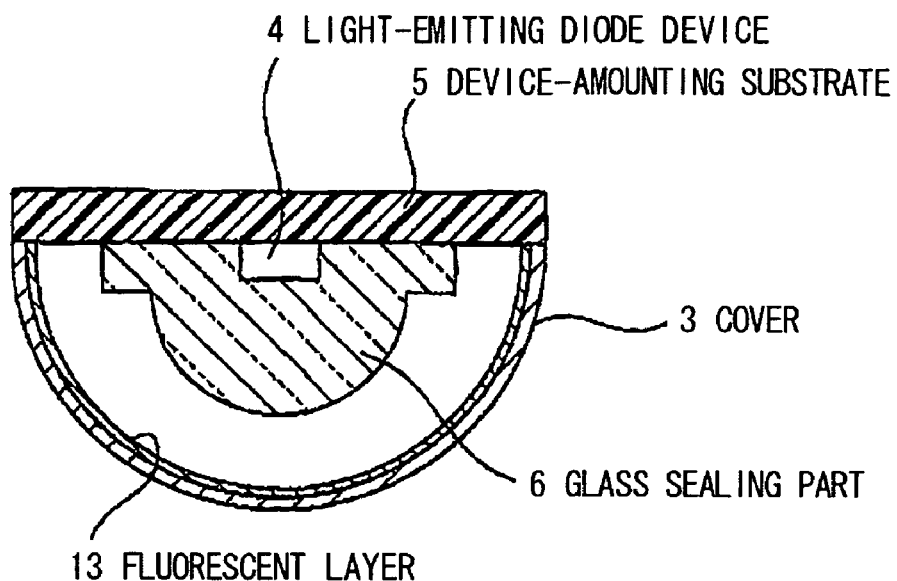
FIG. 5A is a cross sectional view schematically showing a modification of the lighting device comprising a half-round cover in the third preferred embodiment according to the invention.
Figure 5B:
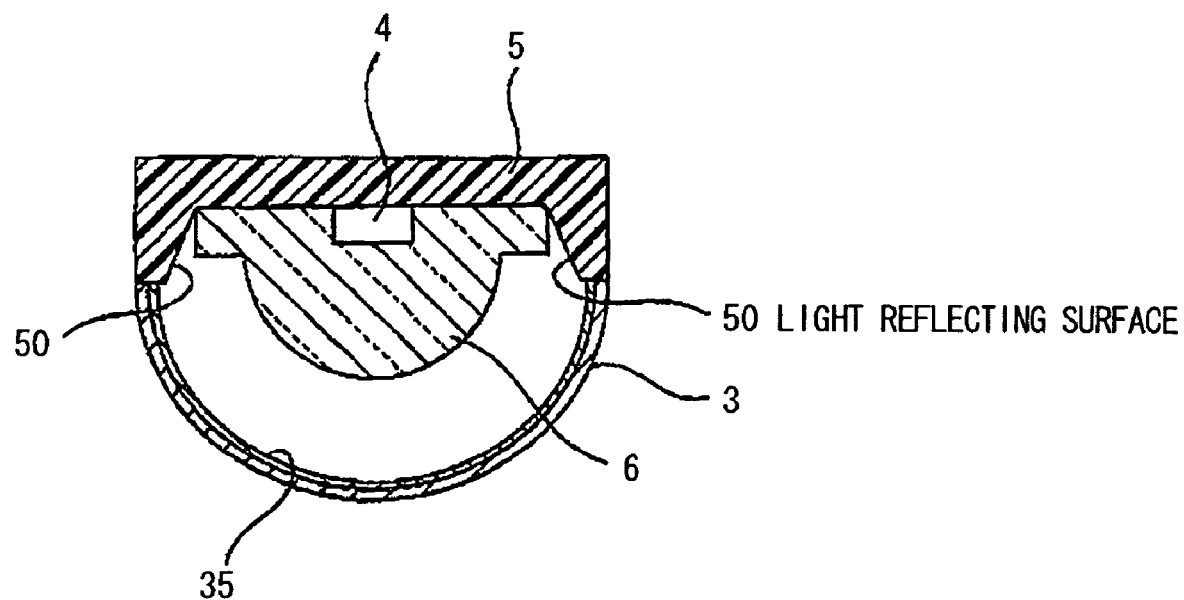
FIG. 5B is a cross sectional view schematically showing a modification of the lighting device comprising a device-mounting substrate having a light reflecting surface in the third preferred embodiment according to the invention.

FIGS. 5A and 5B are cross sectional views schematically showing a modification of the lighting device 1 of the third preferred embodiment As shown in FIG. 5A, the cover 3 has a half-round shape, so that a structure in which it is hard that a light goes around to a side of a back surface of the device-mounting substrate 5 is obtained. Therefore, the light emitted from the light-emitting diode device 4 can be radiated from the cover 3 without omission.

Further, as shown in FIG. 5B, a light reflecting surface 50 is disposed on a neighboring part of the device-mounting substrate 5, so that larger amount of light can be radiated in the light axis direction of the light-emitting diode device 4.

Fourth Embodiment

Figure 6A:
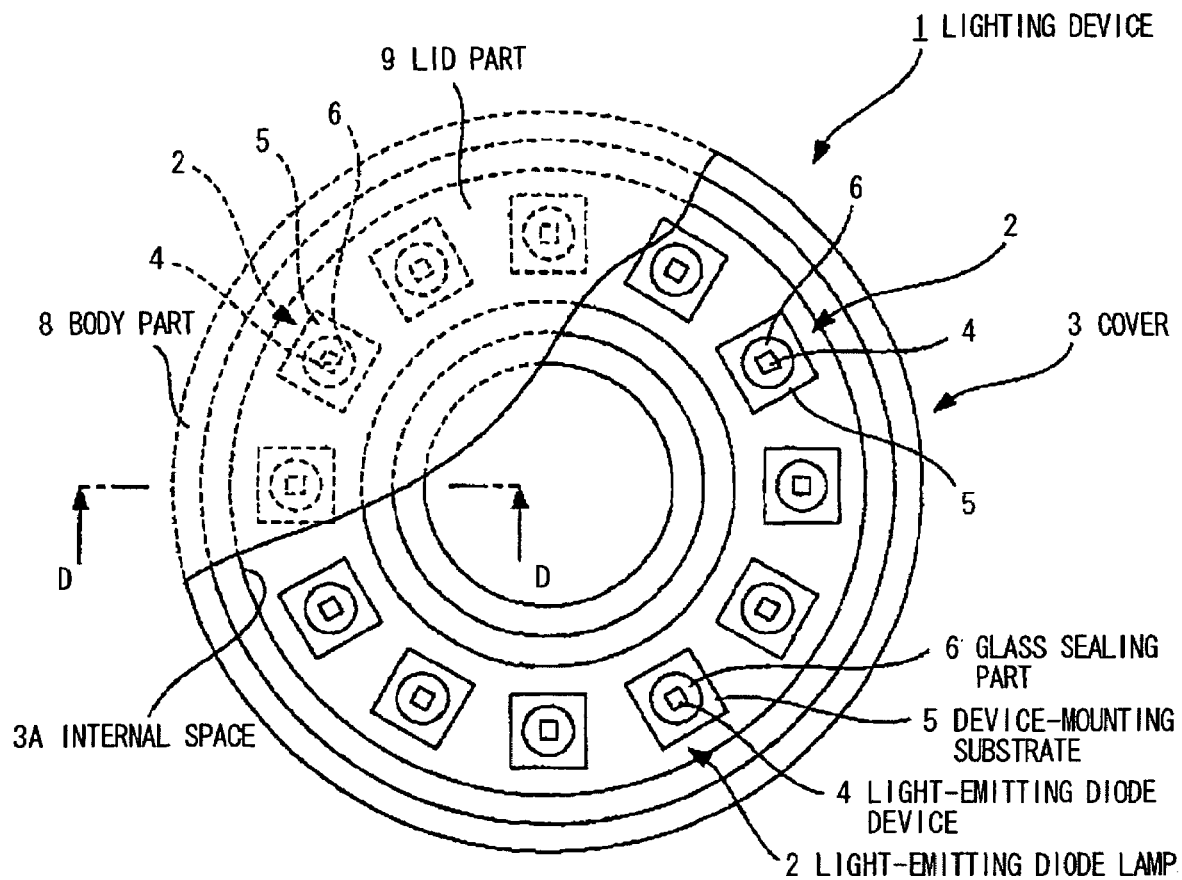
FIG. 6A is a partially removed front view schematically showing a lighting device in a fourth preferred embodiment according to the invention.
Figure 6B:
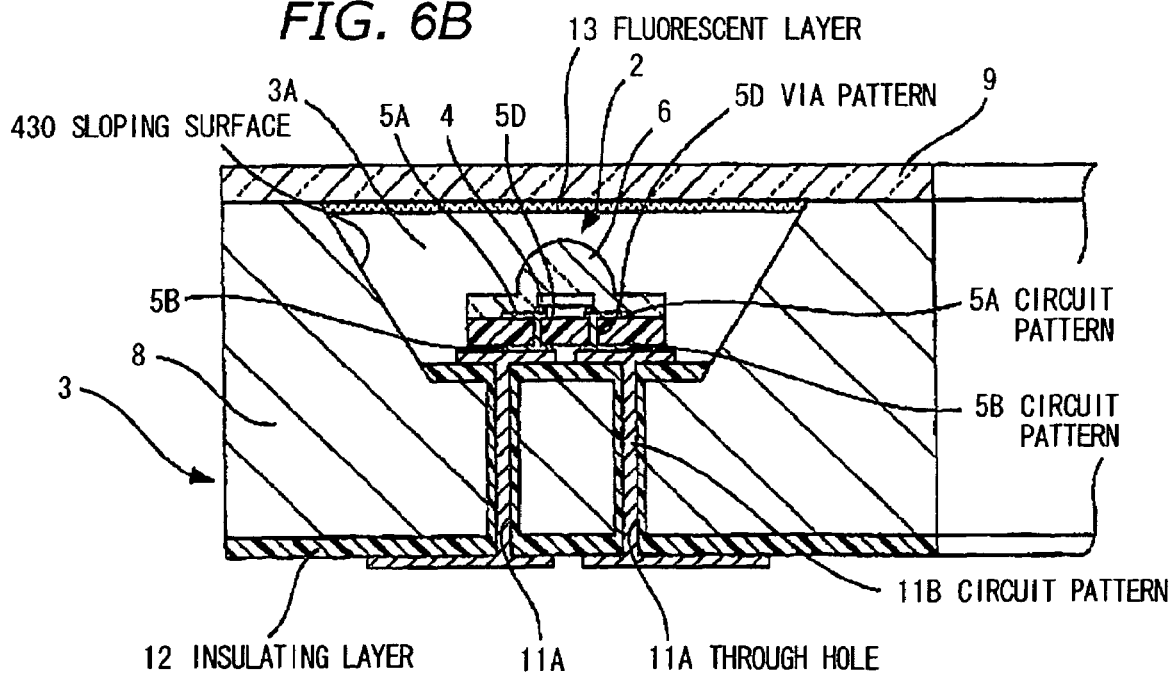
FIG. 6B is a cross sectional view (an enlarged view) taken along the line D-D in FIG. 6A.

In FIGS. 6A and 6B, like components are indicated by using the same numerals as in FIG. 1C and the detailed explanation is omitted.

As shown in FIGS. 6A and 6B, a lighting device 1 of the fourth preferred embodiment has the feature the lighting device 1 comprises plural light-emitting diode lamps 2 disposed in a cover 3, at equal intervals in the circumferential direction.

The cover 3 comprises a body part 8 made of a metal such as copper, aluminum having an internal space 3A (or a groove) being annular-shaped and opening to the side of the illuminated object, and a lid part 9 formed of a translucent member covering the opening of the internal space 3A of the body part 8.

As shown in FIG. 6B, the body part 8 is composed of the annular member (which has an external diameter of about 1 cm) having through holes 11A opening to the bottom surface of the internal space 3A and the back surface of the cover 3 so that the light-emitting diode lamps 2 are mounted in the internal space 3A. On the body part 8, an insulating layer 12 (e.g., an oxide film such as $SiO_2$ and the like, or a plastic film of polyimide series) covering inner surfaces of the through holes 11A, the bottom surface (or the groove bottom) of the internal space 3A and the back surface of the cover 3 is formed. On the insulating layer 12, circuit patterns 11B made of tungsten (W) and connecting to circuit patterns 5B of the device-mounting substrate 5 are formed. The groove wall of the body part 8 (or the internal space 3A) has a sloping surface 430 to receive light emitted from the light-emitting diode lamp 2 and to reflect the light to the side of the illuminated object.

The lid part 9 is disposed on the end face of the opening of the body part 8 and is composed of an annular member made of a glass as a whole. On the lower surface of the lid part 9 on the side of the light-emitting diode lamp 2, the fluorescent layer 13 is formed.

Advantages of the Fourth Embodiment

The advantages obtained by the fourth preferred embodiment in addition to the advantages (1) and (2) of the first preferred embodiment are as follows.

The plural light-emitting diode lamps 2 are disposed in the cover 3, at equal intervals in the circumferential direction, and the groove wall of the body part 8 has the sloping surface 430 to receive light emitted from the light-emitting diode lamp 2 and to reflect the light to the side of the illuminated object, so that the light emitted from the light-emitting diode lamp 2 can be radiated as white light in the direction from the lid part 9 to the illuminated object so as to be spread widely. Therefore, in case of obtaining the round-shaped planar light source, the light output efficiency of the light source can be enhanced.

Fifth Embodiment

Figure 7:
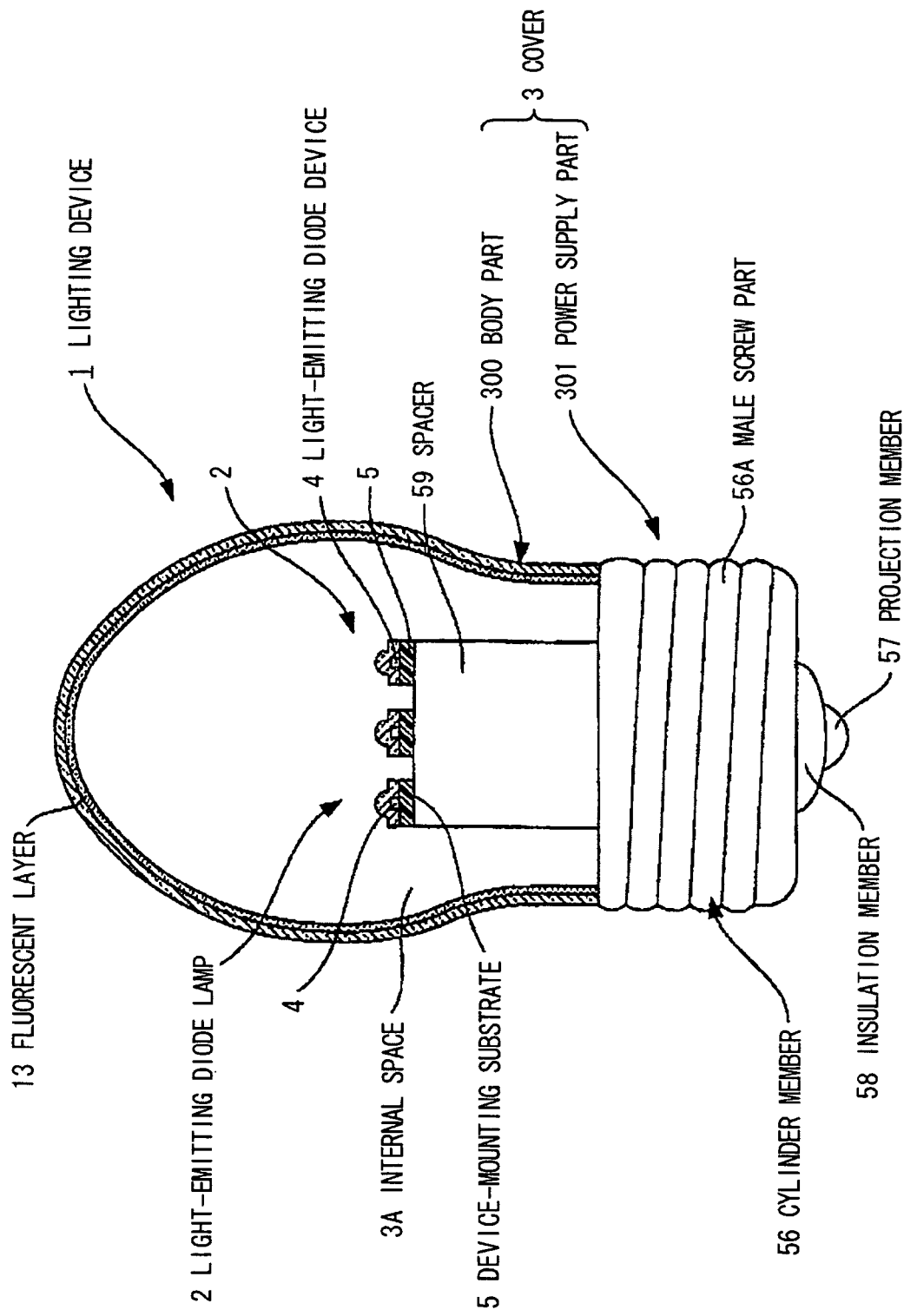
FIG. 7 is a cross sectional view schematically showing a lighting device in a fifth preferred embodiment according to the invention.

In FIGS. 7A and 7B, like components are indicated by using the same numerals as in FIG. 1B and the detailed explanation is omitted.

As shown in FIGS. 7A and 7B, a lighting device 1 of the fifth preferred embodiment has the features that the lighting device 1 comprises, a cover 3 comprising a body member 300 composed of a translucent member having an opening and a power supply part 301 with a screw part for supplying a power supply voltage to light-emitting diode lamps 2 (in this embodiment three lamps).

The body member 300 has an internal space 3A to house the light-emitting diode lamps 2 therein. On the surface (i.e., the inner surface) of the body member 300 on the side of the light-emitting diode lamp 2, the fluorescent layer 13 is formed.

The power supply part 301 comprises a cylinder member 56 as a first electrode part and a projection member 57 as a second electrode part, and is disposed on the end face of the opening of the body part 8. The cylinder member 56 is composed of a tube member opening in the axis direction. On the outer surface of the cylinder member 56, a male screw part 56A connecting to a female screw part (not shown) of a lamp socket is formed in a detachable condition. The projection member 57 is disposed on the periphery of an opening of the cylinder member 56 on an opposite side of the light-emitting diode lamp 2 through an insulation member 58.

The light-emitting diode lamps 2 are mounted on the periphery of the opening of the cylinder member 56 on the side of the light-emitting diode lamp 2 through a cylindrical spacer 59, and are connected to a power supply part 301 (i.e., the cylinder member 56 and the projection member 57).

The spacer 59 has circuit patterns (not shown) connecting to the circuit patterns 11B (shown in FIG. 1C) of the device-mounting substrate 5 and the power supply part 301 respectively, on front-back both surfaces thereof, and the spacer 50 is composed of the same material as the device-mounting substrate 5. In the spacer 59, via holes (not shown) opening to both sides of the circuit patterns (front-back both surfaces) are formed as same as in the case of the device-mounting substrate 5. In the via holes, via patterns (no shown) made of tungsten (W) and connecting to both circuit patterns on front-back both surfaces are formed.

In this embodiment, although the case of using the fluorescent layer 13 to radiate yellow wavelength-converted light by being excited by light (i.e., blue light) emitted from the light-emitting diode device 4 has been explained, the invention is not limited to such case but, another case of using the fluorescent layer 13 to radiate white wavelength-converted light by being excited by light (i.e., violet light with a wavelength of 370-390 nm) emitted from the light-emitting diode device 4 is also applicable.

Advantages of the Fifth Embodiment

The advantages obtained by the fifth preferred embodiment in addition to the advantage (1) of the first preferred embodiment are as follows.

On the outer surface of the cylinder member 56, the male screw part 56A connecting to the female screw part (not shown) of the lamp socket is formed in the detachable condition, so that the lighting device 1 can be mounted on the lamp socket by screwing the male screw part 56A and the female screw part together, and the lighting device 1 can be detached from the lamp socket by releasing the screwing of the male screw part 56A and the female screw part. Thus, the mounting and detaching can be easily conducted.

Sixth Embodiment

Figure 8A:
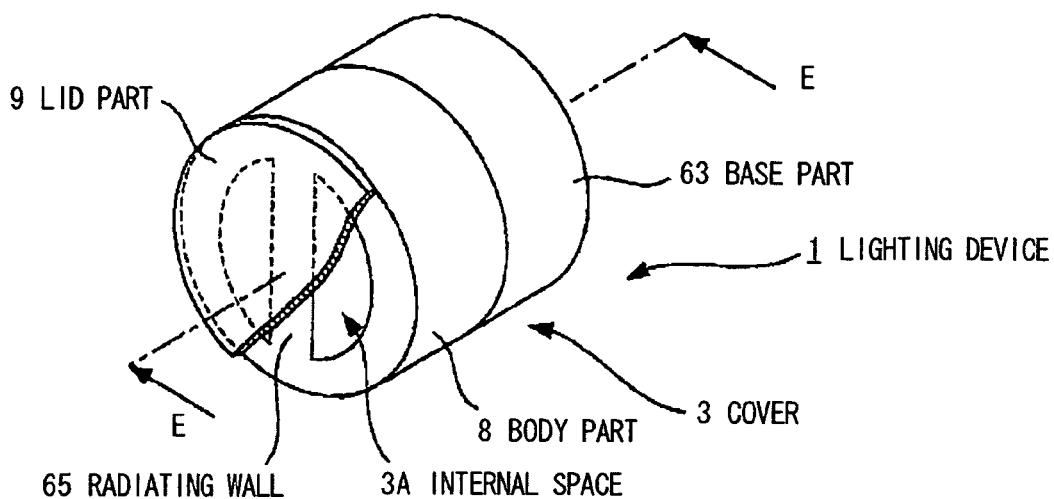
FIG. 8A is a partially removed perspective view schematically showing a lighting device in a sixth preferred embodiment according to the invention.
Figure 8B:
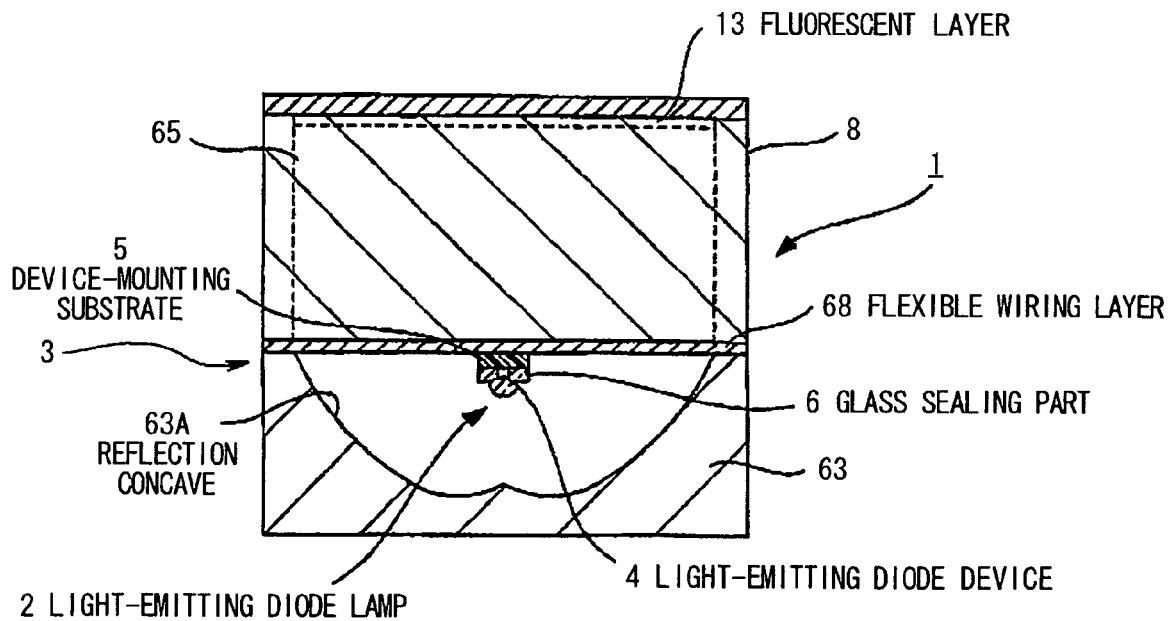
FIG. 8B is a cross sectional view (an enlarged view) taken along the line E-E in FIG. 8A.

In FIGS. 8A and 8B, like components are indicated by using the same numerals as in FIG. 1B and the detailed explanation is omitted.

As shown in FIGS. 8A and 8B, a lighting device 1 of the sixth preferred embodiment has the features that the lighting device 1 comprises a light-emitting diode lamp 2 to emit light to the opposite side to the illuminated object, and a cover 3 having a reflective surface to receive light emitted from the light-emitting diode lamp 2 and to reflect the light to the side of the illuminated object.

The cover 3 comprises a base part 63 having a reflection concave 63A to receive light emitted from the light-emitting diode lamp 2 and to reflect the light to the side of the illuminated object, a body part 8 having an internal space 3A opening to the side of the illuminated object and to the opposite side to the illuminated object and a radiation wall 65 dividing the internal space 3A to two chambers, and a lid part 9 covering the opening of the body part 8 on the side of the illuminated object.

The base part 63 is composed of a circular cylinder member with a bottom opening to the side of the illuminated object. The body part 8 is connected to the end face of the opening of the base part 63, and is composed of a bottomless circular cylinder member opening to the side of the illuminated object and to the opposite side to the illuminated object. The base part 63 and the body part 8 are made of a metal such as copper, aluminum and the like. The lid part 9 is disposed on the end face of the opening of the body part 8 on the side of the illuminated object and on the end face of the radiating wall 65 on the side of the illuminated object, and is composed of a plane round-shaped translucent member made of a glass as a whole. On the end face of the lid part 9 on the side of the light-emitting diode lamp 2a, the fluorescent layer 13 is formed.

The light-emitting diode lamp 2 is mounted on a device-mounting part (not shown) of a flexible wiring layer 68 disposed between the end face of the radiating wall 65 on the opposite side to the illuminated object and the end surface of the opening of the reflection concave 63A so as to emit light to the reflection concave 63A.

Advantages of the Sixth Embodiment

The advantages obtained by the sixth preferred embodiment in addition to the advantage (1) of the first preferred embodiment are as follows.

The light-emitting diode lamp 2 is disposed in the cover 3 made of a metal, so that, when heat generated from the light-emitting diode device 4 is radiated to the internal space of the reflection concave 63A and the internal space 3A of the body part 8, the radiated heat can be dissipated to outside through the base part 63 and the body part 8 to enhance the radiating effect. Therefore, the lighting device 1 of the sixth preferred embodiment can be extremely effective when used for the lighting device comprising the light-emitting diode lamp 2 with a large heat generation value (i.e., a large light output).

Seventh Embodiment

Figure 9A:
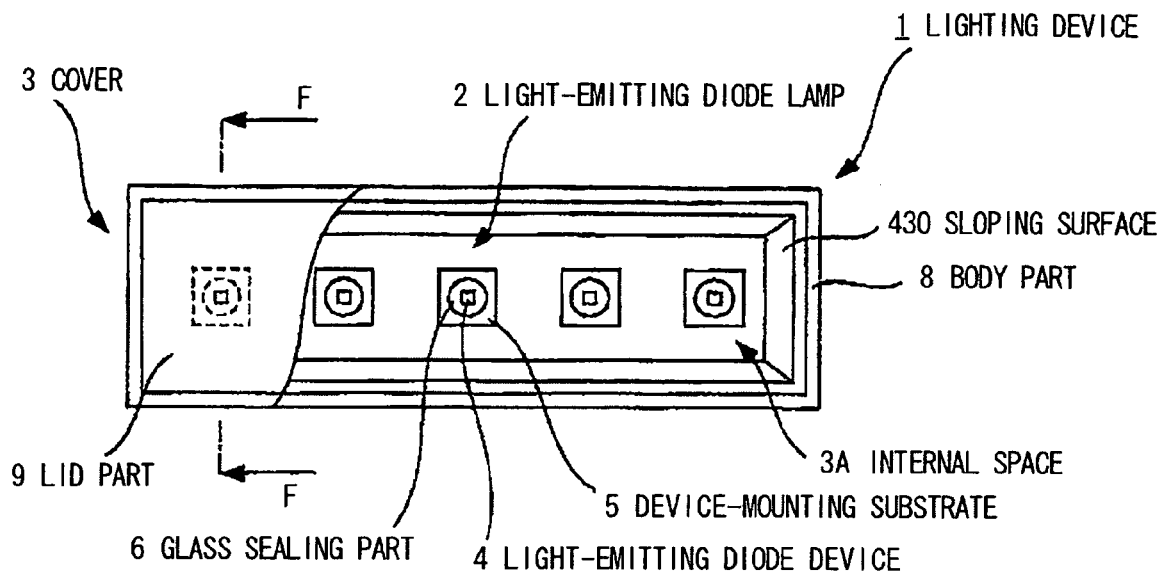
FIG. 9A is a partially removed front view schematically showing a lighting device in a seventh preferred embodiment according to the invention.
Figure 9B:
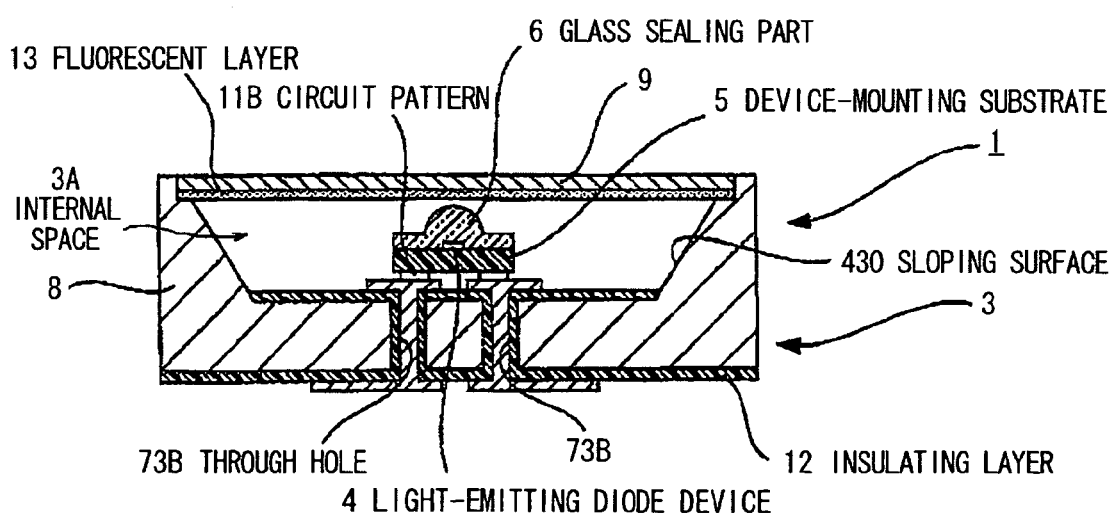
FIG. 9B is a cross sectional view (an enlarged view) taken along the line F-F in FIG. 9A.

In FIGS. 9A and 9B, like components are indicated by using the same numerals as in FIG. 1C and the detailed explanation is omitted.

As shown in FIGS. 9A and 9B, a lighting device 1 of the seventh preferred embodiment has the feature that the lighting device 1 comprises a cover 3 which has a reflecting surface and can house plural light-emitting diode lamps 2 disposed in one direction on the same plane.

The cover 3 comprises a body part 8 made of a metal such as copper, aluminum having an internal space 3A (or a groove) opening to the side of the illuminated object, and a lid part 9 covering the opening of the internal space 3A of the body part 8.

As shown in FIG. 9B, the body part 8 is composed of a block member having through holes 73B opening to the bottom surface of the internal space 3A and the back surface of the cover 3, and the light-emitting diode lamp 2 is mounted in the internal space 3A. On the body part 8, an insulating layer 12 (e.g., an oxide film such as $SiO_2$ and the like, or a polyimide plastic film) covering inner surfaces of the through holes 73B, the bottom surface (or the groove bottom) of the internal space 3A and the back surface of the cover 3 is formed. On the insulating layer 12, circuit patterns 5B made of tungsten (W) and connecting to circuit patterns 5B (shown in FIG. 1C) of the device-mounting substrate 5 are formed. The groove wall of the body part 8 (or the internal space 3A) has a sloping surface 430 to receive light emitted from the light-emitting diode lamp 2 and to reflect the light to the side of the illuminated object.

The lid part 9 is disposed on the end face of the opening of the body part 8 and is composed of a rectangle-shaped translucent member made of a glass as a whole. On the lower surface of the lid part 9 on the side of the light-emitting diode lamp 2, the fluorescent layer 13 is formed.

Advantages of the Seventh Embodiment

The advantages obtained by the seventh preferred embodiment in addition to the advantage (1) of the first preferred embodiment are as follows.

(1) The light-emitting diode lamp 2 is disposed in the body part 8 made of a metal, so that heat generated from the light-emitting diode device 4 can be dissipated to outside through the body part 8. Thus, the radiating effect can be enhanced.

(2) The plural light-emitting diode lamps 2 are disposed in one direction, and the groove wall of the body part 8 has the sloping surface 430 to receive light emitted from the light-emitting diode lamp 2 and to reflect the light to the side of the illuminated object, so that the light emitted from the light-emitting diode lamp 2 can be radiated as white light in the direction from the lid part9 to the illuminated object so as to be spread widely. Therefore, in case of obtaining the rectangle-shaped planar light source, the light output efficiency of the light source can be enhanced.

Eighth Embodiment

Figure 10:
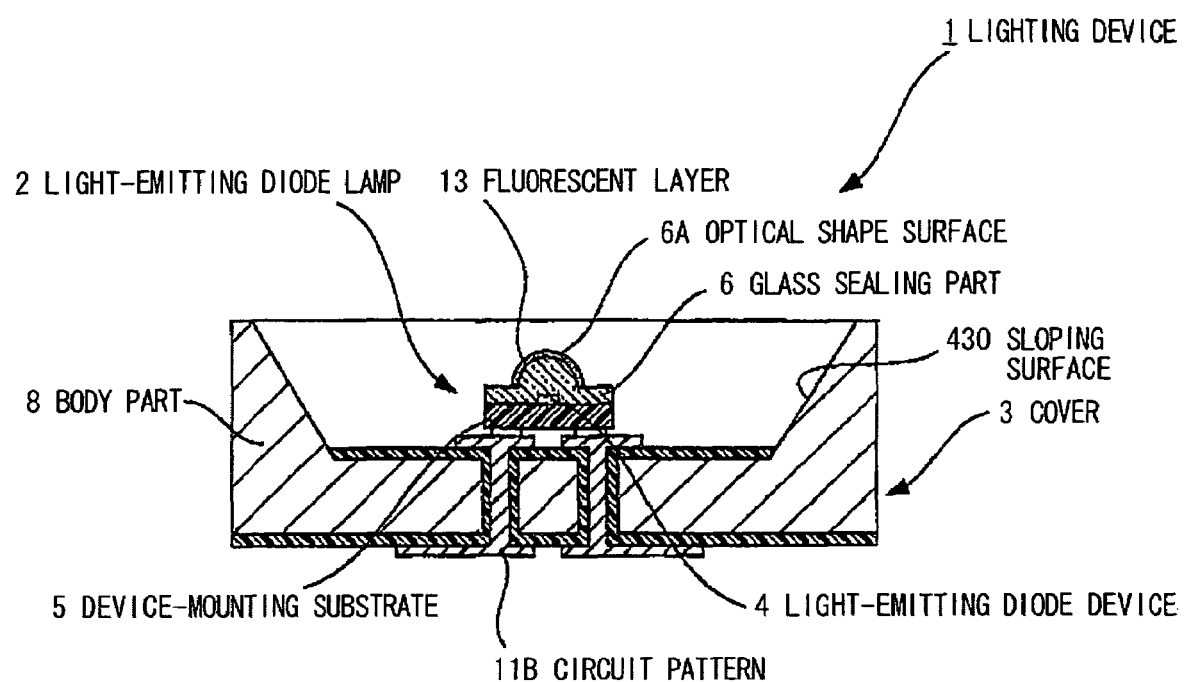
FIG. 10 is a cross sectional view schematically showing a lighting device in an eighth preferred embodiment according to the invention (a modification of the lighting device in the seventh preferred embodiment according to the invention)

In FIG. 10, like components are indicated by using the same numerals as in FIG. 9B and the detailed explanation is omitted.

As shown in FIG. 10, a lighting device 1 shown as an eighth preferred embodiment has the feature that the lighting device 1 comprises a cover 3 (which corresponds to a cover removed the lid part . 9 from the cover 3 shown in the seventh preferred embodiment) having only a body part 8.

On a surface (i.e., an optical shape surface 6A of the glass sealing part 6) on the side of the illuminated object of the light-emitting diode lamp 2, a half round-shaped fluorescent layer 13 is formed in a film shape.

Advantages of the Eighth Embodiment

The following advantages are obtained by the eighth preferred embodiment as explained above in addition to the advantages obtained by the seventh preferred embodiment.

The cover 3 is composed of the body part 8, so that parts numbers of the cover 3 can be reduced, comparing with the cover 3 of the lighting device 1 shown in the seventh preferred embodiment. Therefore, the manufacturing cost can be reduced.

Ninth Embodiment

Figure 11A:
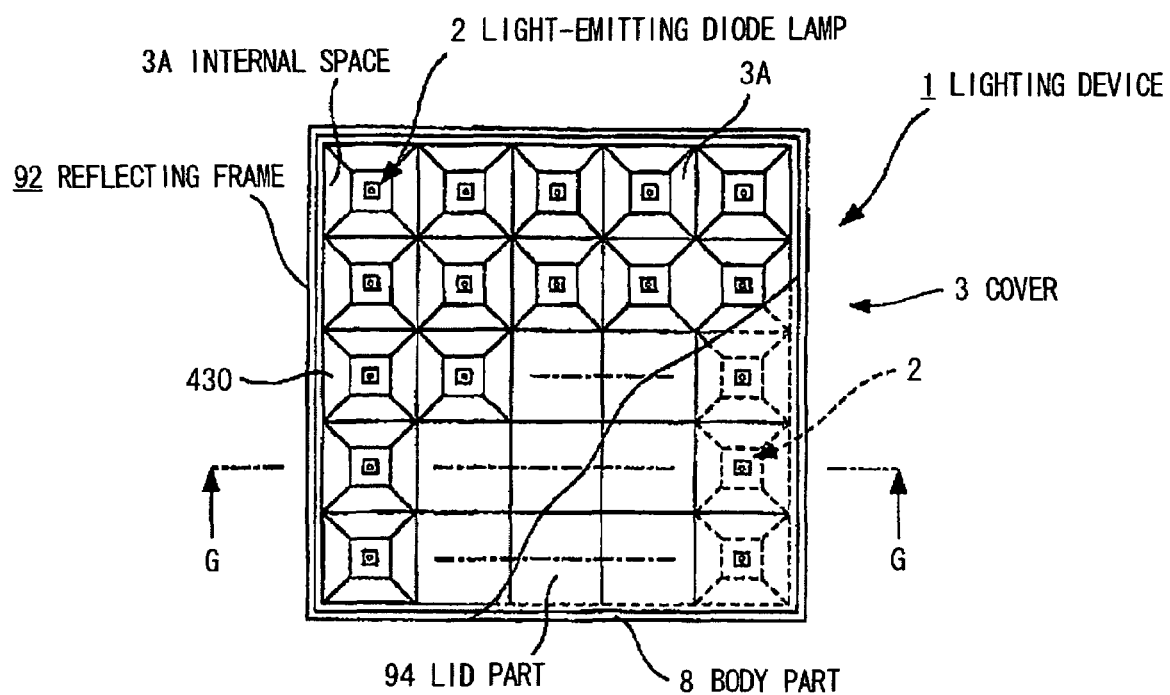
FIG. 11A is a partially removed front view schematically showing a lighting device in a ninth preferred embodiment according to the invention.
Figure 11B:
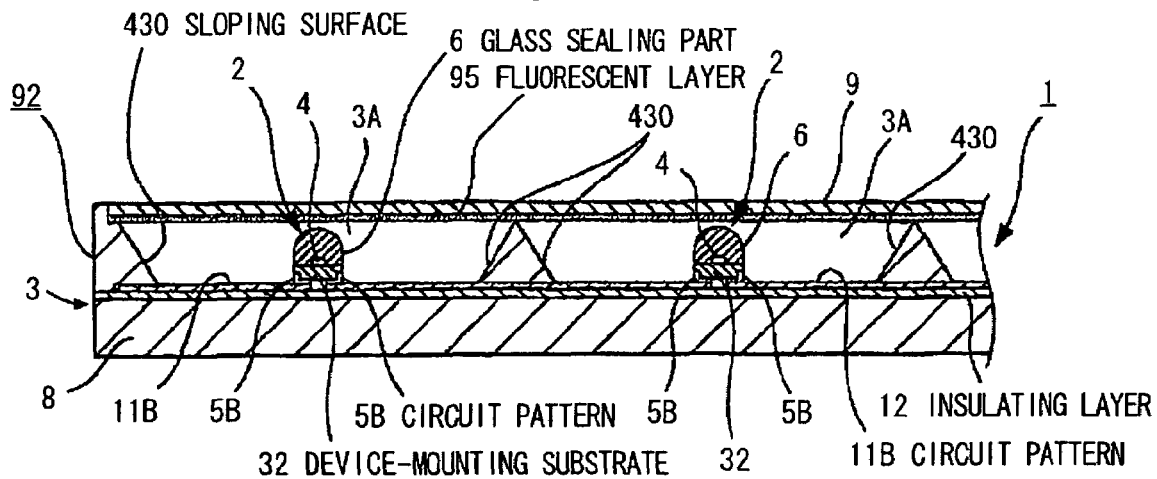
FIG. 11B is a cross sectional view (an enlarged view) taken along the line G-GF in FIG. 11A.

In FIGS. 11A and 11B, like components are indicated by using the same numerals as in FIG. 1C and the detailed explanation is omitted.

As shown in FIGS. 11A and 11B, a lighting device 1 shown as a ninth preferred embodiment has the features that the lighting device 1 comprises a cover 3 which has a reflecting surface and can house plural light-emitting diode lamps 2 disposed in lengthwise and crosswise directions on the same plane.

The cover 3 comprises a body part 8 made of a metal such as copper, aluminum, comprising plural internal spaces 3A having a truncated pyramid shape, and opening to the side of the illuminated object, and also disposed in lengthwise and crosswise directions on the same plane (in this embodiment five spaces in the lengthwise direction and five spaces in the crosswise direction are disposed), and a lid part 94 covering the opening of the internal spaces 3A of the body part 8.

As shown in FIG. 11B, the body part 8 is formed like a flat plate made of copper having a good heat conductance. On a device-mounting surface of the body part 8, an insulating layer 12 is formed and the insulating layer 12 is composed of, e.g., an oxide film such as $SiO_2$ and the like, or a plastic film of polyimide series. And also, on the insulating layer 12, circuit patterns 11B made of tungsten (W) and connecting to circuit patterns 5B (shown in FIG. 1C) of the device-mounting substrate 5 are formed.

Reflecting frame 92 has four sloping surfaces 430 centering on the light-emitting diode lamp 2 disposed in each of the internal spaces 3A, so that the reflecting frame 92 receives light emitted from the light-emitting diode lamp 2 and reflects the light to the side of the illuminated object. Further, the reflecting frame 92 is laminated on the side of the device-mounting surface of the body part 8.

On the end face of the opening of the body part 8, a lid part 94 is disposed, and the lid part 94 is composed of a square-shaped plate made of a glass as a whole. On the end face of the lid part 94 on the side of the light-emitting diode lamp 2, the fluorescent layer 13 is formed.

Advantages of the Ninth Embodiment

The following advantages are obtained by the ninth preferred embodiment as explained above in addition to the advantage (1) obtained by the first preferred embodiment.

(1) The light-emitting diode lamp 2 is disposed in the body part 9 made of a metal, so that a heat generated by an emission of the light-emitting diode device 4 is diffused to outside through each of the wall parts constituting the internal space 3A. Therefore, a radiating effect can be enhanced.

(2) The plural light-emitting diode lamps 2 are disposed in lengthwise and crosswise directions, and the wall parts constituting the internal space 3A has a sloping surface 430 to receive light emitted from the light-emitting diode lamp 2 and to reflect the light to the side of the illuminated object, so that the light emitted from the light-emitting diode lamp 2 can be radiated-as white light in the direction from the lid part 94 to the illuminated object so as to be spread widely. Therefore, in case of obtaining the square-shaped planar light source, the light output efficiency of the light source can be enhanced.

Tenth Embodiment

Figure 12A:
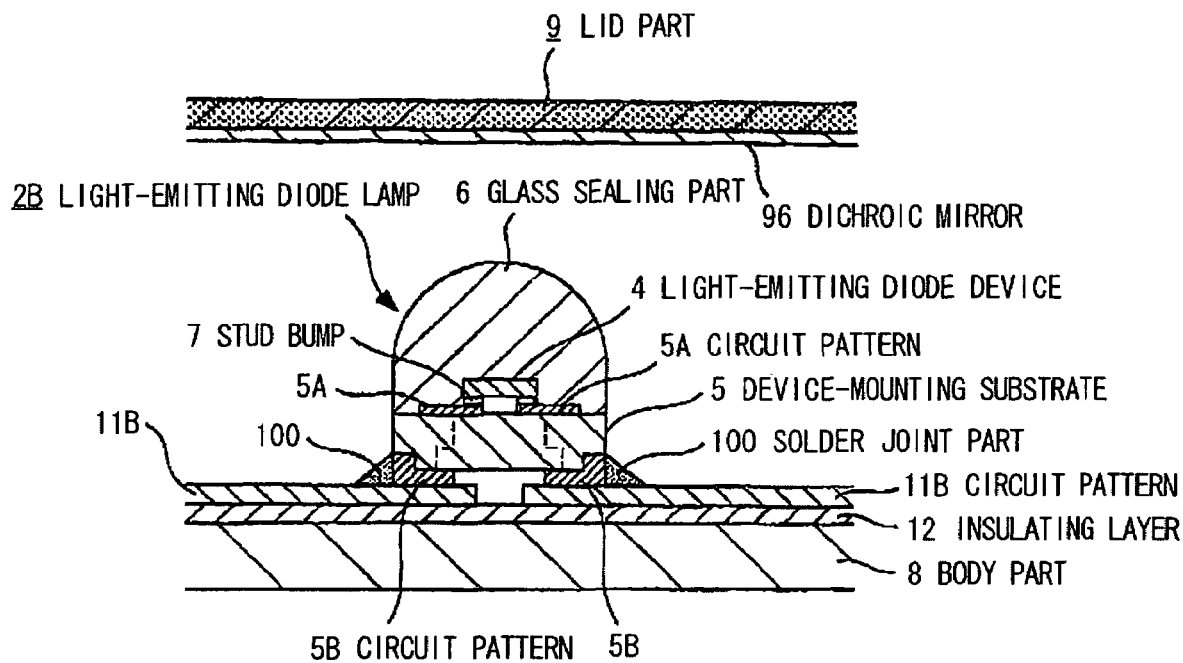
FIG. 12A is a partial cross sectional view schematically showing a lighting device comprising a blue light-emitting diode lamp in a tenth preferred embodiment according to the invention.

As shown in FIG. 12A, a lighting device 1 of the tenth preferred embodiment has the features that the lighting device 1 comprises a lid part 9 made of an acrylic polymer containing a YAG phosphor, and a dichroic mirror 96 disposed on the lower surface of the lid part 9 on the side of the light-emitting diode lamp 2B to pass blue light therethrough and to reflect yellow light. Further, in the tenth preferred embodiment, the circuit patterns 5B of the light-emitting diode lamp 2B are connected to the circuit patterns 11B through a solder joint part 100.

Figure 12B:
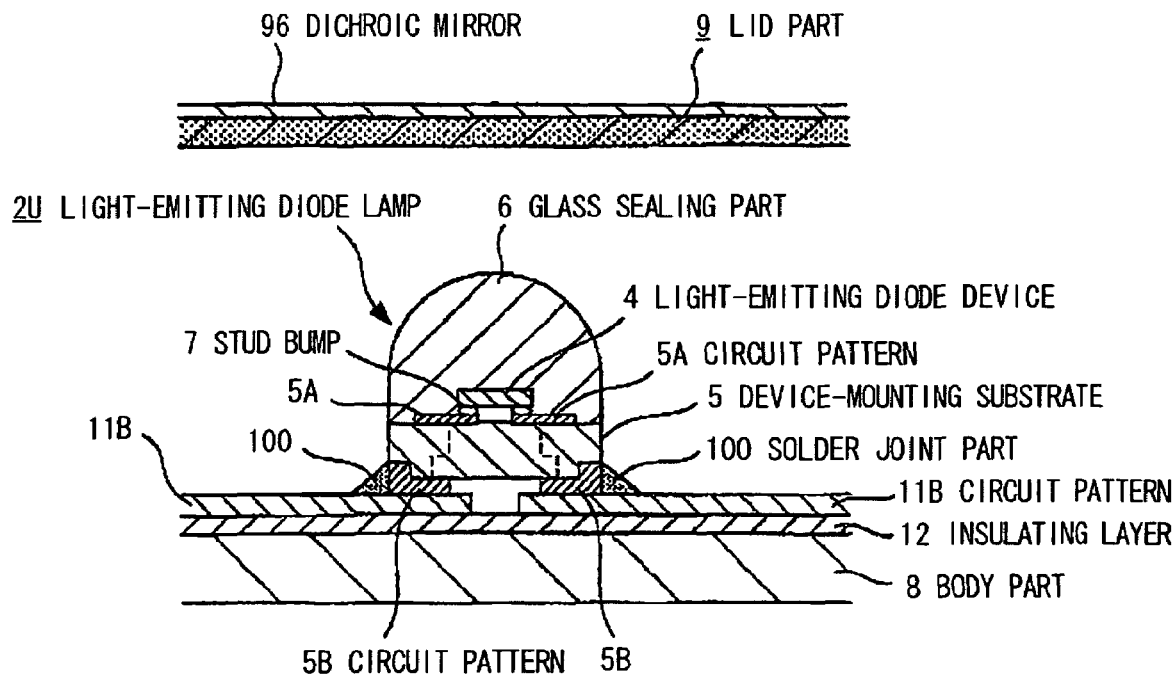
FIG. 12B is a partial cross sectional view schematically showing a lighting device comprising a ultra-violet light-emitting diode lamp in the tenth preferred embodiment according to the invention.

On the other hand, as shown in FIG. 12B, a lighting device 1 of the tenth preferred embodiment has the features that the lighting device 1 comprises a lid part 9 made of an acrylic polymer containing RGB phosphors to be excited by ultraviolet radiation, and a dichroic mirror 96 disposed on the upper surface of the lid part 9 on the light-emitting side to prevent the ultraviolet radiation to outside. This dichroic mirror 96 has characteristics to pass through red light, green light and blue light emitted from the RGB phosphors, and white light obtained by mixing the three lights described above.

Advantage of the Tenth Embodiment

The advantages obtained by the tenth preferred embodiment are as follows.

According to the lighting device 1 shown in FIG. 12A, the YAG phosphor in the lid part 9 is excited by blue light, the YAG phosphor radiates yellow light, and the yellow light is reflected on the dichroic mirror 96 so as to accelerate the mixing of the blue light and the yellow light, so that white light without color unevenness can be easily obtained.

According to the lighting device 1 shown in FIG. 12B, the ultraviolet radiation is sufficiently radiated to the lid part 9 containing the RGB phosphors, so that white light with good mixture property of red light, green light and blue light can be obtained. Further, the dichroic mirror 96 suppresses the external emission of the ultraviolet radiation, so that it can prevent peripheral devices of the lighting device 1 from suffering damage by the ultraviolet radiation.

Eleventh Embodiment

Figure 13:
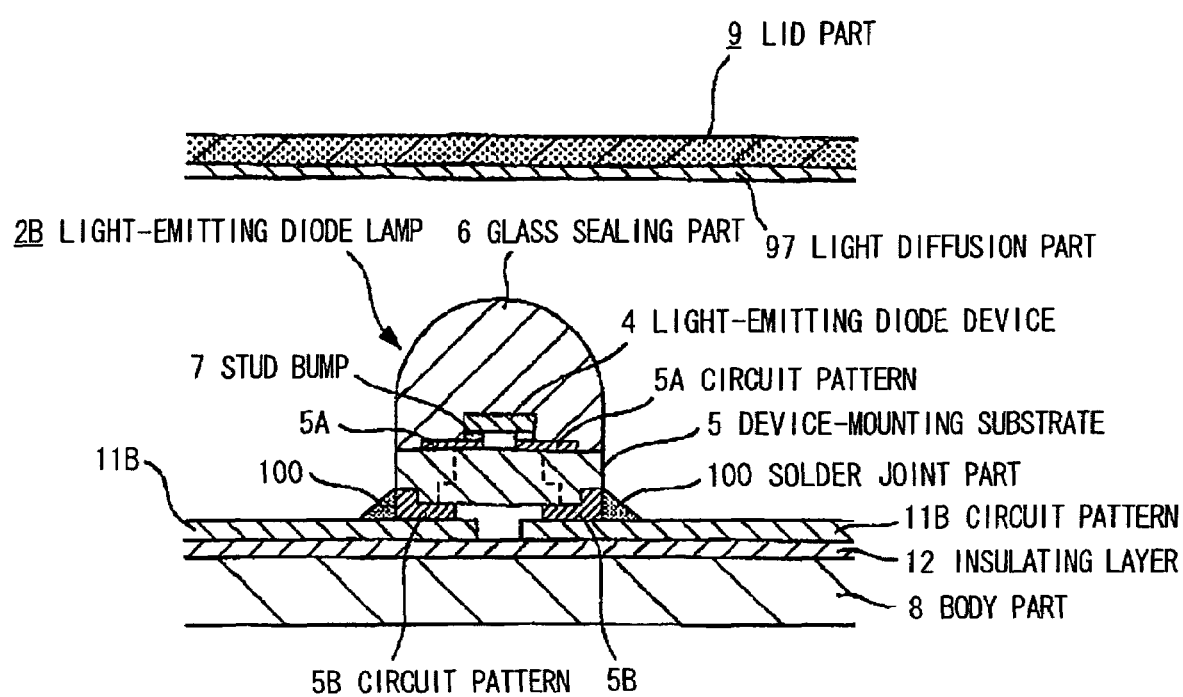
FIG. 13 is a partial cross sectional view schematically showing a lighting device in an eleventh preferred embodiment according to the invention.

As shown in FIG. 13, a lighting device 1 of the eleventh preferred embodiment has the features that the lighting device 1 comprises a light diffusion part 97 disposed on the surface of the lid part 9 on the side of the light-emitting diode lamp 2B, instead of the dichroic mirror 96 shown in the tenth preferred embodiment.

Advantages of the Eleventh Embodiment

The light diffusion part 97 is disposed on the lid part 9, so that the blue light emitted from the light-emitting diode lamp 2B can be sufficiently irradiated to the YAG phosphor. Thereby, white light without color unevenness can be obtained.

Twelfth Embodiment

Figure 14:
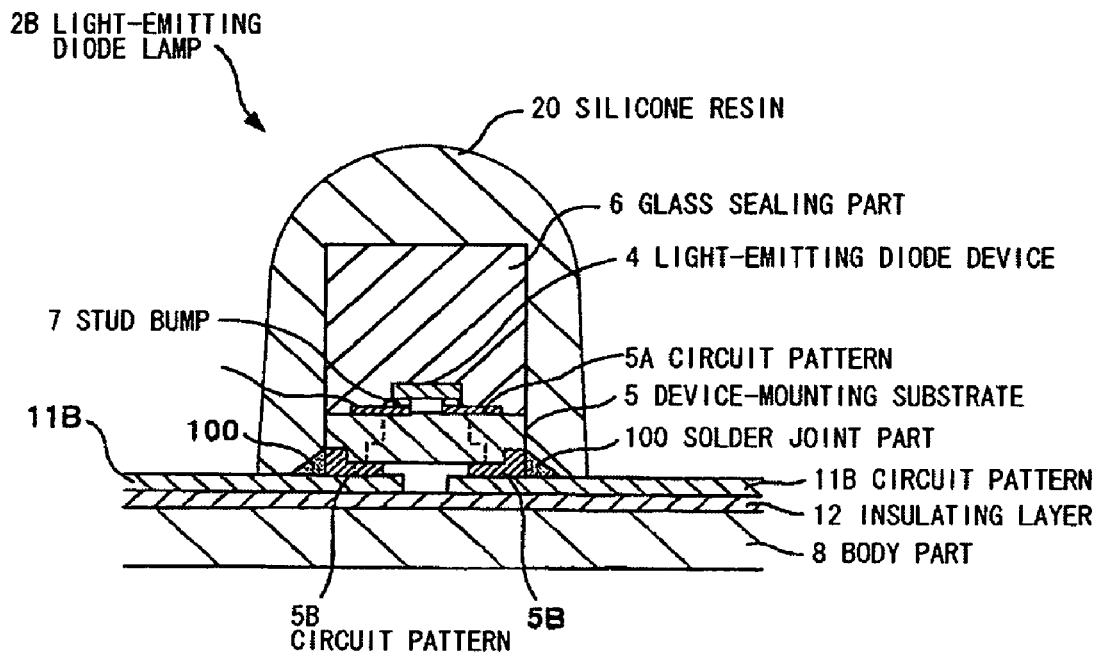
FIG. 14 is a partial cross sectional view schematically showing a light-emitting diode lamp in a twelfth preferred embodiment according to the invention.

As shown in FIG. 14, a light-emitting diode lamp 2B of the twelfth preferred embodiment has the features that the light-emitting diode lamp 2B comprises the glass sealing part 6 that is shaped like a rectangular parallelepiped, and a silicone resin 20 that covers the glass sealing part 6, the device-mounting substrate 5, circuit patterns 11B etc. The silicone resin 20 has a refractive index of about n=1.4 and is formed such that, after mounting the light-emitting diode lamp 2B sealed by the glass sealing part 6 on the body part 8, a silicone resin material is coated thereon and is hardened while rendering the body part 8 upside down to be shaped like a convex lens.

Any one of the above embodiments 1-11 can employ the structure of the light-emitting diode lamp 2B of this embodiment.

Meanwhile, like components are indicated by using the same numerals as in FIG. 12 and the detailed explanation is omitted.

Advantages of the Twelfth Embodiment

Since the glass sealing part 6 is shaped like a rectangular parallelepiped, the light-emitting diode lamp 2B can be easy fabricated to enhance the mass productivity.

Although, in case of not using the silicone resin 20, the rectangular parallelepiped glass sealing part 6 may cause an optical loss due to the light confinement inside the glass sealing part 6, the light extraction efficiency can be improved by the easy measure, i.e., using the convex lens-shaped silicone resin 20 even when using the rectangular parallelepiped glass sealing part 6.

Thirteenth Embodiment

Figure 15:
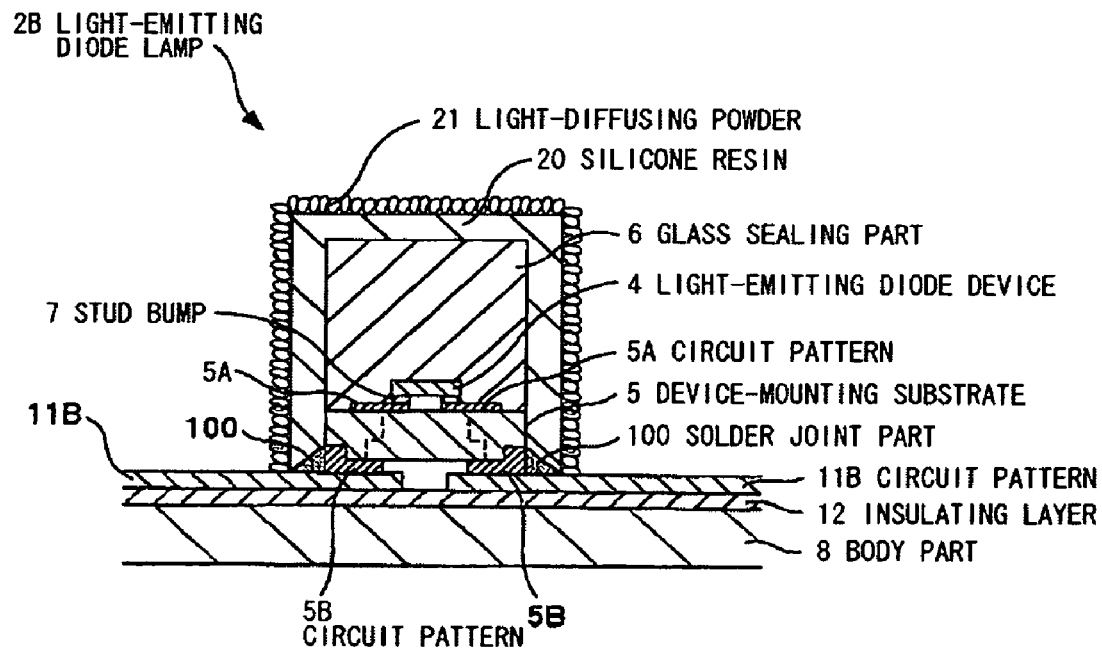
FIG. 15 is a partial cross sectional view schematically showing a light-emitting diode lamp in a thirteenth preferred embodiment according to the invention.

As shown in FIG. 15, a light-emitting diode lamp 2B of the thirteenth preferred embodiment has the features that the light-emitting diode lamp 2B comprises the glass sealing part 6 that is shaped like a rectangular parallelepiped, a silicone resin 20 that covers the glass sealing part 6, the device-mounting substrate 5, circuit patterns 11B etc., and a light-diffusing powder 21 is disposed to cover the outer surface of the silicone resin 20. The silicone resin 20 has a refractive index of n=about 1.4. Each particle composing the light-diffusing powder 21 has a refractive index of about n=about 1.5.

Any one of the above embodiments 1-11 can employ the structure of the light-emitting diode lamp 2B of this embodiment.

Meanwhile, like components are indicated by using the same numerals as in FIG. 12 and the detailed explanation is omitted.

Advantages of the Thirteenth Embodiment

Since the glass sealing part 6 is shaped like a rectangular parallelepiped, the light-emitting diode lamp 2B can be easy fabricated to enhance the mass productivity.

Further, due to the light-diffusing effect of the light-diffusing powder 21 (with n=1.5), the light extraction efficiency from the inside of the glass sealing part 6 can be improved even when using the rectangular parallelepiped glass sealing part 6, which may cause an optical loss due to the light confinement inside the glass sealing part 6.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A lighting device, comprising:
a light-emitting diode lamp comprising a light-emitting diode device sealed by a glass sealing part; and
a fluorescent layer disposed on a side of an illuminated object of the light-emitting diode lamp,
wherein the fluorescent layer radiates a wavelength-converted light by being excited by light emitted from the light-emitting diode device,
wherein a space is formed between the light-emitting diode lamp and the fluorescent layer, and
wherein the light-emitting diode device comprises a p-contact electrode, the p-contact electrode comprising a conductive oxide film comprising a same thermal expansion coefficient as a semiconductor material composing the light-emitting diode device.

2. The lighting device according to claim 1, wherein:
the light-emitting diode lamp further comprises a device-mounting substrate for mounting the light-emitting diode device; and
the lighting device comprises a plurality of the light-emitting diode lamps disposed in lengthwise and crosswise directions on a same plane.

3. The lighting device according to claim 1, wherein:
the light-emitting diode lamp further comprises: a plurality of the light-emitting diode devices disposed in lengthwise and crosswise directions on a same plane; and
a single device-mounting substrate for mounting the plurality of the light-emitting diode devices; and
the plurality of the light-emitting diode devices are arrayed through the glass sealing part.

4. The lighting device according to claim 1, wherein:
the light-emitting diode lamp further comprises: a plurality of the light-emitting diode devices disposed in one direction on a same plane; and
a single device-mounting substrate for mounting the plurality of the light-emitting diode devices; and
the lighting device further comprises a transparent member which houses the light-emitting diode lamp therein; and
the transparent member comprises a curved surface.

5. The lighting device according to claim 1, wherein the lighting device further comprises a cover to house the light-emitting diode lamp therein.

6. The lighting device according to claim 5, wherein at least a part of the cover comprises a heat radiation member for mounting a device-mounting substrate to mount the light emitting diode device thereon.

7. The lighting device according to claim 5, wherein:
the cover comprises an annular internal space opening toward the illuminated object; and
a plurality of the light-emitting diode lamps are disposed in the internal space in a circumferential direction.

8. The lighting device according to claim 5, wherein: the cover comprises a body part comprising a transparent member forming an internal space to house the light-emitting diode lamp therein; and
a power supply part with a screw part for supplying a power supply voltage to the light-emitting diode lamp.

9. The lighting device according to claim 5, wherein:
the cover comprises:
a base part comprising a concave reflection surface to receive light emitted from the light-emitting diode lamp and to reflect the light toward the illuminated object;
a body part comprising an internal space opening on a side of the illuminated object and on an opposite side to the illuminated object; and a heat radiation wall to divide the internal space into two chambers.

10. The lighting device according to claim 5, wherein:

the cover comprises an internal space opening on a side of the illuminated object and a reflecting surface to receive light emitted from the light-emitting diode lamp and to reflect the light toward the illuminated object in the internal space; and a plurality of the light-emitting diode lamps are disposed in the internal space in one direction on a same plane.

11. The lighting device according to claim 5, wherein:

the cover comprises:

a plurality of internal spaces opening on a side of the illuminated object and disposed in lengthwise and crosswise directions on a same plane; and a plurality of reflecting surfaces to receive light emitted from a plurality of the light-emitting diode lamps each corresponding to the internal spaces and to reflect the light toward the illuminated object; and the plurality of the light-emitting diode lamps are disposed in the plurality of the internal spaces to which each of the light-emitting diode lamps corresponds.

12. The lighting device according to claim 5, wherein:

the fluorescent layer is disposed closely on a side of the light-emitting diode lamp of the cover.

13. The lighting device according to claim 5, wherein:

the cover comprises:

an internal space opening toward the illuminated object; and a reflecting surface to receive light emitted from the light-emitting diode lamp and to reflect the light toward the illuminated object in the internal space; and the fluorescent layer is disposed closely on a side of the illuminated object of the glass sealing part.

14. The lighting device according to claim 1, further comprising:

a cover comprising a body part and a lid part, wherein the cover encloses the light-emitting diode lamp and the fluorescent layer, wherein the light-emitting diode device emits light of a first wavelength through an internal space to excite the fluorescent layer to radiate the wavelength-converted light, and wherein the fluorescent layer mixes light of a first wavelength and the wavelength-converted light and discharges light of a second wavelength through the lid part to illuminate the illuminated object.

15. A lighting device, comprising:

a light-emitting diode lamp comprising a light-emitting diode device sealed by a glass sealing part; and a fluorescent layer disposed on a side of an illuminated object of the light-emitting diode lamp, wherein the fluorescent layer radiates a wavelength-converted light by being excited by light emitted from the light-emitting diode device, wherein a space is formed between the light emitting diode lamp and the fluorescent layer, and wherein the light-emitting diode lamp further comprises a resin material sealing the glass sealing part and a light-diffusing material disposed on the resin material, and wherein the glass sealing part comprises a rectangular parallelepiped shape.

16. The lighting device according to claim 15, wherein:

the resin material is shaped like a convex lens.

* * * * *